(12) United States Patent
Tan et al.

(10) Patent No.: US 12,154,854 B2
(45) Date of Patent: Nov. 26, 2024

(54) ELECTRONIC FUSES WITH A SILICIDE LAYER HAVING MULTIPLE THICKNESSES

(71) Applicant: GlobalFoundries Singapore Pte. Ltd., Singapore (SG)

(72) Inventors: Shyue Seng Tan, Singapore (SG); George Mulfinger, Wilton, NY (US); Eng Huat Toh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 30 days.

(21) Appl. No.: 17/570,626

(22) Filed: Jan. 7, 2022

(65) Prior Publication Data

US 2023/0223336 A1 Jul. 13, 2023

(51) Int. Cl.
*H01L 29/66* (2006.01)
*H01L 23/525* (2006.01)

(52) U.S. Cl.
CPC ........ *H01L 23/5256* (2013.01); *H01L 29/665* (2013.01)

(58) Field of Classification Search
CPC .............. H01L 29/665; H01L 23/5256; H01L 23/5252; H01L 23/525; H01L 2924/1453; H10B 20/20; H10B 20/25
USPC ......... 257/209, 529, 530, E23.149; 438/381, 438/601
See application file for complete search history.

(56) References Cited

U.S. PATENT DOCUMENTS

| | | | |
|---|---|---|---|
| 8,013,419 B2 | 9/2011 | Kim et al. | |
| 2003/0219971 A1* | 11/2003 | Cabral, Jr. | ...... H01L 21/823814 438/587 |
| 2005/0282324 A1* | 12/2005 | Ohuchi | ............ H01L 29/41783 438/320 |
| 2007/0222028 A1 | 9/2007 | Matsuoka et al. | |
| 2009/0039480 A1* | 2/2009 | Lee | ...................... H01L 23/5256 257/E23.149 |
| 2009/0051002 A1* | 2/2009 | Booth, Jr. | ............ H01L 23/5256 257/529 |
| 2009/0309184 A1* | 12/2009 | Kim | ..................... H01L 23/5256 257/E23.149 |
| 2010/0072571 A1 | 3/2010 | Min | |
| 2011/0156857 A1* | 6/2011 | Kurz | ................... H01L 29/7848 337/414 |
| 2012/0001295 A1* | 1/2012 | Kurz | ................... H01L 23/5256 257/E23.141 |
| 2012/0257435 A1* | 10/2012 | Lin | ..................... H01L 23/5256 365/96 |
| 2012/0275208 A1* | 11/2012 | Li | ........................... H01L 21/84 365/96 |
| 2013/0241031 A1* | 9/2013 | Li | ........................... H10B 69/00 257/E23.149 |
| 2020/0411666 A1 | 12/2020 | Mulfinger et al. | |

* cited by examiner

*Primary Examiner* — David Chen
(74) *Attorney, Agent, or Firm* — Thompson Hine LLP

(57) ABSTRACT

Structures for an electronic fuse and methods of forming an electronic fuse. The structure includes a first terminal, a second terminal, and a fuse link extending from the first terminal to the second terminal. The structure further includes a silicide layer having a first portion included in the fuse link and a second portion included in the first terminal and the second terminal. The first portion of the silicide layer has a first thickness, the second portion of the silicide layer has a second thickness, and the first thickness is less than the second thickness.

7 Claims, 5 Drawing Sheets

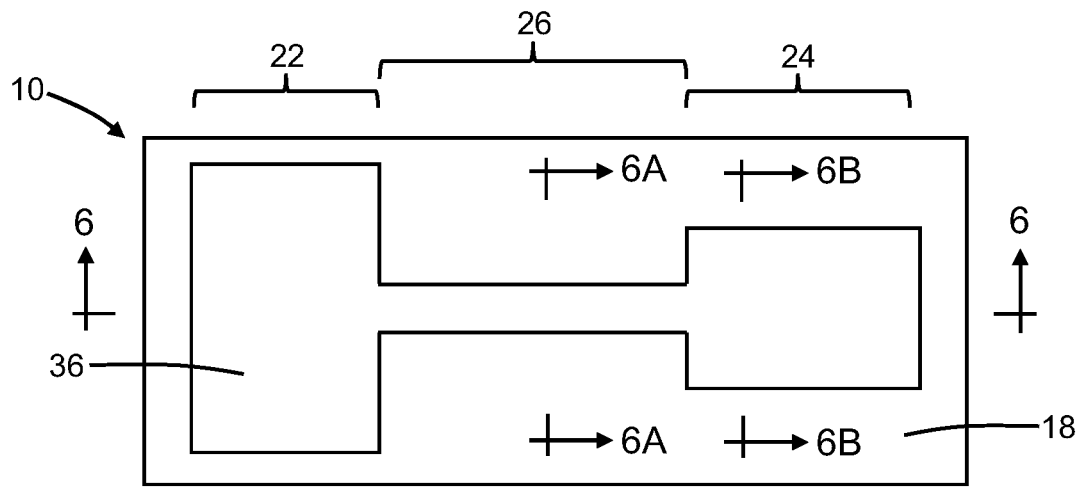
FIG. 5
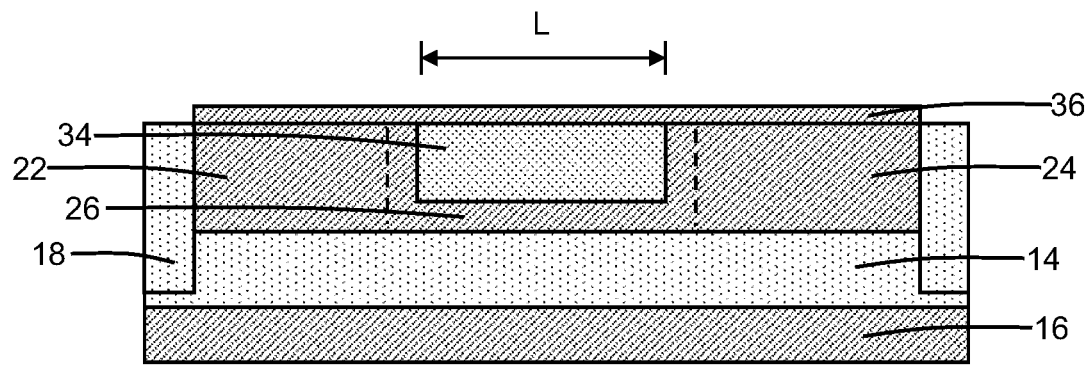
FIG. 6
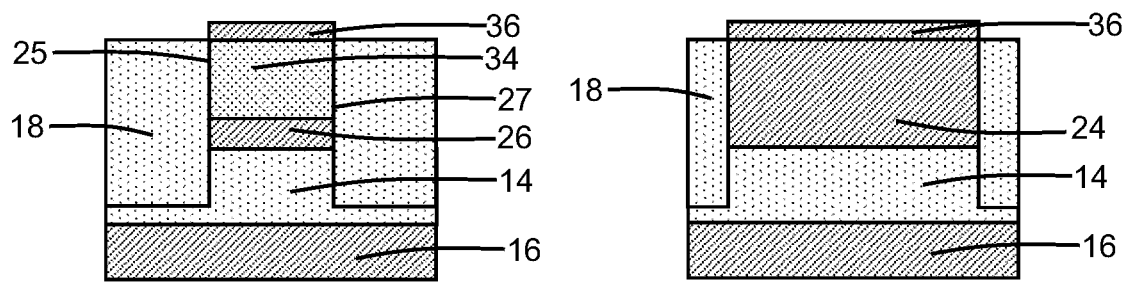
FIG. 6A
FIG. 6B

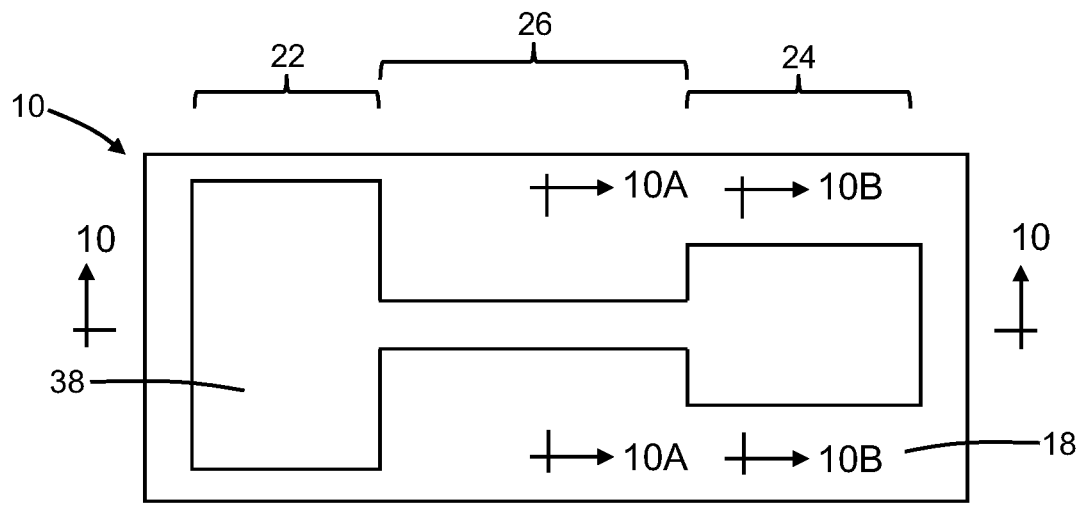
FIG. 9
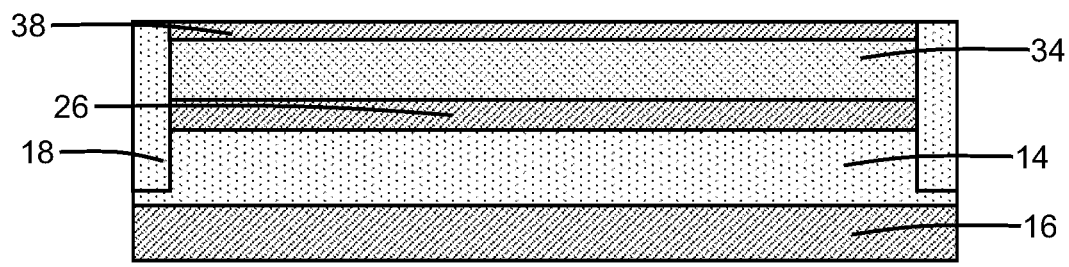
FIG. 10
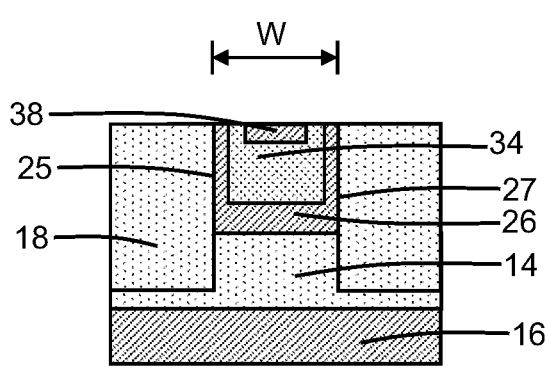 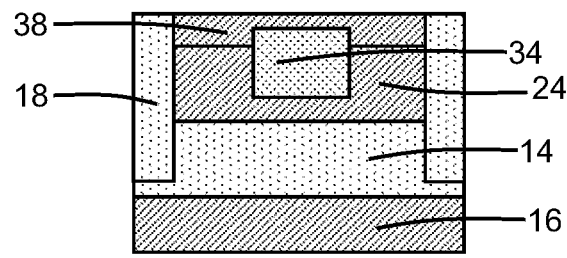
FIG. 10A          FIG. 10B

ELECTRONIC FUSES WITH A SILICIDE LAYER HAVING MULTIPLE THICKNESSES

BACKGROUND

The disclosure relates generally to semiconductor devices and integrated circuit fabrication and, in particular, to structures for an electronic fuse and methods of forming an electronic fuse.

Programmable devices, such as electronic fuses (efuses), are widely-used elements found in various programmable integrated circuits, such as redundancy circuits of dynamic random access memories and static random access memories, programmable logic devices, input/output circuits, and chip identification circuits. Electronic fuses may also constitute elements of a built-in self-repair system for a chip that internally monitors chip functionality. If needed, the self-repair system can automatically activate one or more electronic fuses in response to a change in a monitored function.

An electronic fuse includes a pair of terminals defining an anode and a cathode, as well as a narrow fuse link connecting the anode and cathode. When manufactured, an electronic fuse is initially intact between the anode and cathode. Electronic fuses may be irreversibly programmed by passing an electrical current of relatively high current density through the fuse link. Large programming currents may cause an abrupt temperature increase in the fuse link that blows the fuse link. The electronic fuse in its programmed state has a significantly higher electrical resistance than the electronic fuse in its unprogrammed state.

Improved structures for an electronic fuse and methods of forming an electronic fuse are needed.

SUMMARY

In an embodiment, a structure for an electronic fuse is provided. The structure comprises a first terminal, a second terminal, and a fuse link extending from the first terminal to the second terminal. The structure further comprises a silicide layer having a first portion included in the fuse link and a second portion included in the first terminal and the second terminal. The first portion of the silicide layer has a first thickness, the second portion of the silicide layer has a second thickness, and the first thickness is less than the second thickness.

In an embodiment, a method of forming a structure for an electronic fuse is provided. The method comprises forming a first terminal, a second terminal, and a fuse link extending from the first terminal to the second terminal, and forming a silicide layer having a first portion included in the fuse link and a second portion included in the first terminal and the second terminal. The first portion of the silicide layer has a first thickness, the second portion of the silicide layer has a second thickness, and the first thickness is less than the second thickness.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 5 is a top view of the structure at a fabrication stage subsequent to FIG. 3.

FIG. 6 is a cross-sectional view taken generally along line 6-6 in FIG. 5.

FIG. 6A is a cross-sectional view taken generally along line 6A-6A in FIG. 5.

FIG. 6B is a cross-sectional view taken generally along line 6B-6B in FIG. 5.

FIG. 9 is a top view of a structure for an electronic fuse in accordance with alternative embodiments of the invention.

FIG. 10 is a cross-sectional view taken generally along line 10-10 in FIG. 9.

FIG. 10A is a cross-sectional view taken generally along line 10A-10A in FIG. 9.

FIG. 10B is a cross-sectional view taken generally along line 10B-10B in FIG. 9.

DETAILED DESCRIPTION

Figure 1:
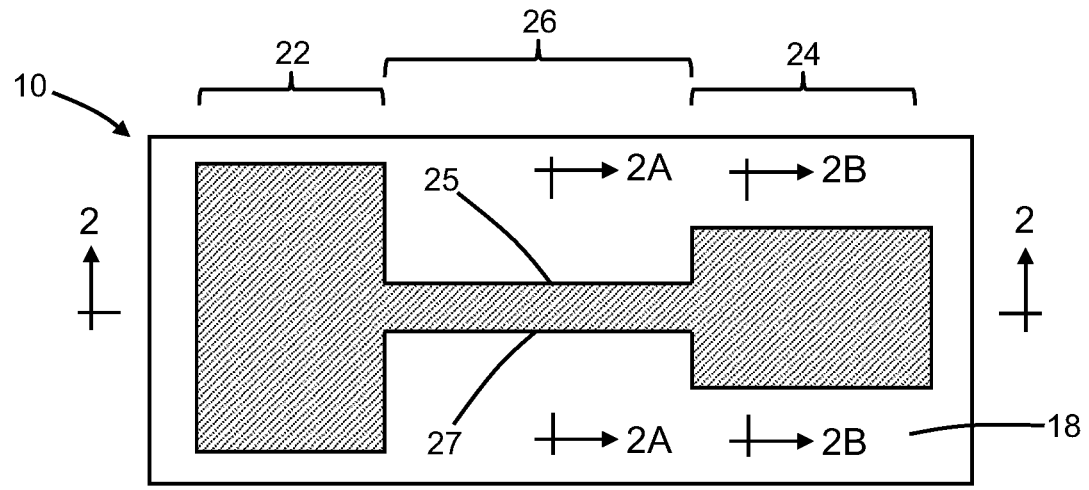
FIG. 1 is a top view of a structure for an electronic fuse at an initial fabrication stage of a fabrication method in accordance with embodiments of the invention.
Figure 2:
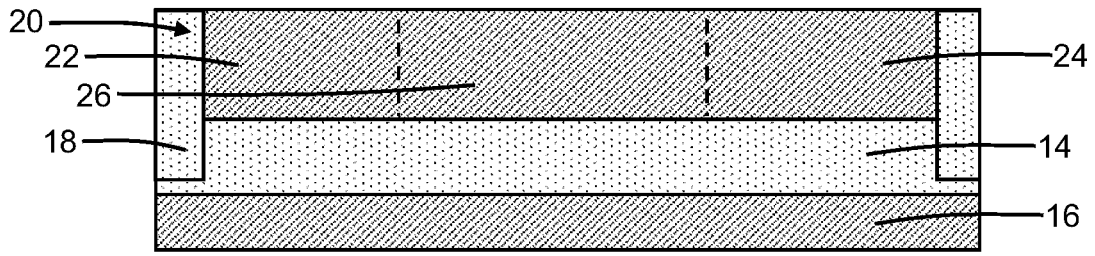
FIG. 2 is a cross-sectional view taken generally along line 2-2 in FIG. 1.
Figures 2A, 2B:
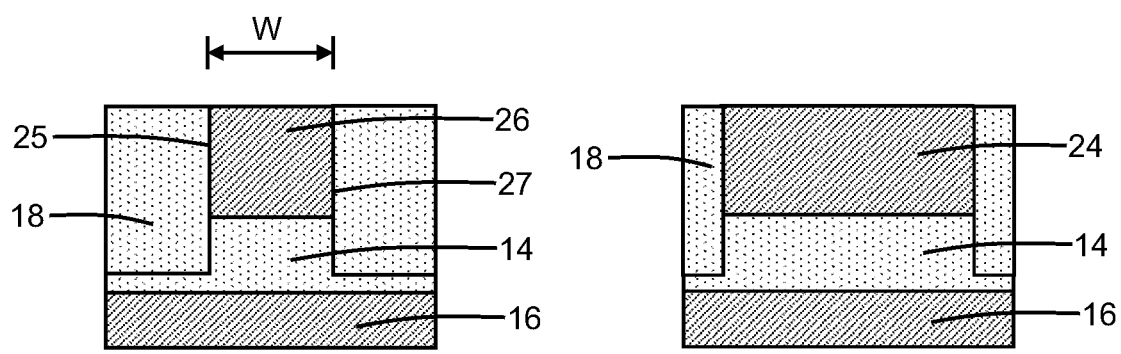
FIG. 2A is a cross-sectional view taken generally along line 2A-2A in FIG. 1.
FIG. 2B is a cross-sectional view taken generally along line 2B-2B in FIG. 1.

With reference to FIGS. 1, 2, 2A, 2B and in accordance with embodiments of the invention, an electronic fuse 10 (i.e., efuse) may be formed on a dielectric layer 14 from a semiconductor layer 20. A shallow trench isolation region 18 is formed by patterning a trench extending through the semiconductor layer 20 by lithography and etching processes, depositing a dielectric material to fill the trench, and planarizing and/or recessing the dielectric material. The electronic fuse 10 may be shaped from the semiconductor layer 20 by the patterning of the trench used to form the shallow trench isolation region 18. The shallow trench isolation region 18 may extend fully through the semiconductor layer 20 and may fully surround the electronic fuse 10. The dielectric layer 14 and the shallow trench isolation region 18 may each contain a dielectric material, such as silicon dioxide, that is an electrical insulator.

In an embodiment, the semiconductor layer 20 from which the electronic fuse 10 is formed may be the device layer of a semiconductor-on-insulator substrate, which further includes a buried insulator layer providing the dielectric layer 14 and a handle substrate 16. In the representative embodiment, the semiconductor layer 20 may be comprised of a single-crystal semiconductor material, such as single-crystal silicon. In an alternative embodiment, the semiconductor layer 20 may be a deposited layer comprised of a polycrystalline semiconductor material, such as polysilicon. In an embodiment, the semiconductor layer 20 may have a thickness in a range of about 10 nanometers (nm) to about 200 nm.

The electronic fuse 10 includes a terminal 22, a terminal 24, and a fuse link 26 that extends longitudinally between an interface with a side surface of the terminal 22 and an opposite interface with a side surface of the terminal 24. The fuse link 26 has a narrower cross-sectional area than either the terminal 22 or the terminal 24 and, in particular, the fuse link 26 may have a width W that is less than the width of either of the terminals 22, 24. The fuse link 26 may have opposite sidewalls 25, 27 that each extend from the terminal 22 to the terminal 24 and between which the width W may be measured. In an embodiment, the terminal 22 may define a cathode of the electronic fuse 10, and the terminal 24 may define an anode of the electronic fuse 10.

Figure 3:
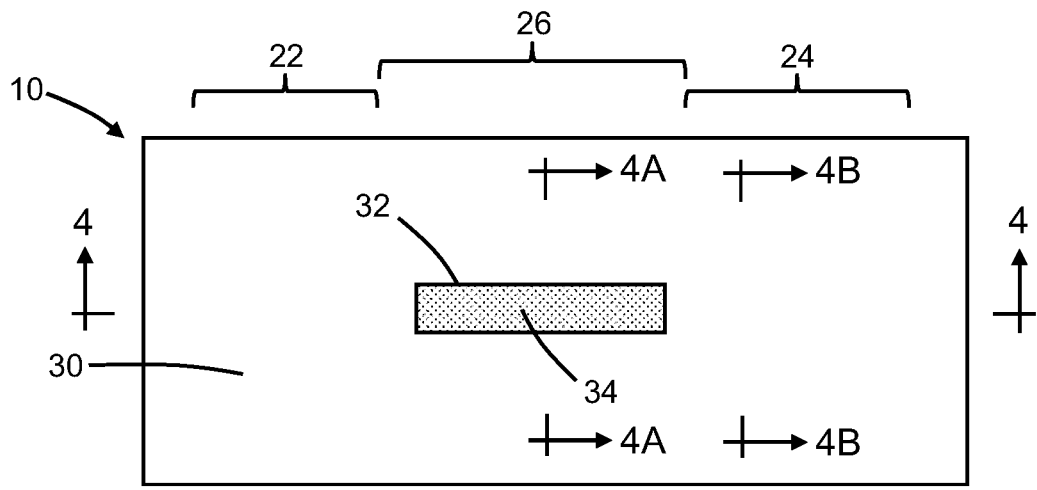
FIG. 3 is a top view of the structure at a fabrication stage subsequent to FIG. 1.
Figure 4:
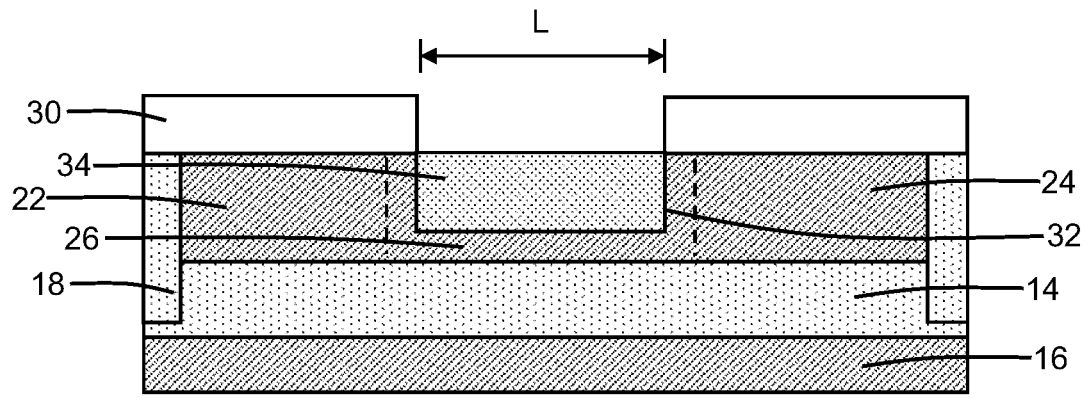
FIG. 4 is a cross-sectional view taken generally along line 4-4 in FIG. 3.
Figure 4A:
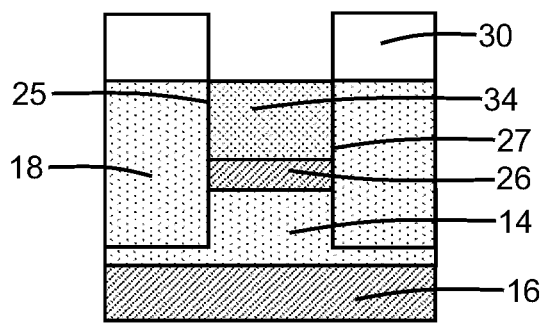
FIG. 4A is a cross-sectional view taken generally along line 4A-4A in FIG. 3.
Figure 4B:
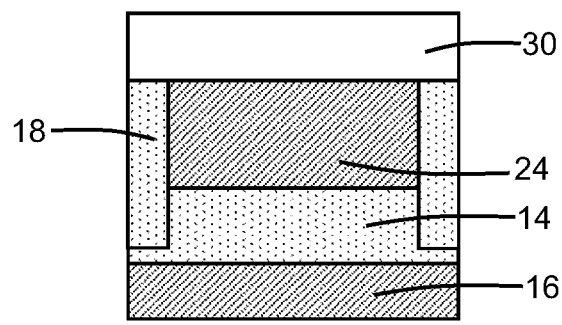
FIG. 4B is a cross-sectional view taken generally along line 4B-4B in FIG. 3.

With reference to FIGS. 3, 4, 4A, 4B in which like reference numerals refer to like features in FIGS. 1, 2, 2A, 2B and at a subsequent fabrication stage, a dielectric layer 30, which may be comprised of a dielectric material such as silicon nitride, is formed. The dielectric layer 30 is patterned by lithography and etching processes to define a hardmask having an opening arranged over a portion of the fuse link 26. The terminals 22, 24 and portions of the fuse link 26 adjacent to each of the terminals 22, 24 are covered by the dielectric layer 30.

A trench 32 is formed in the fuse link 26 at the location of the opening in the dielectric layer 30. In an embodiment, an etching process, such as a reactive ion etching process, may be used to form the trench 32. The trench 32 extends only partially through the thickness of the fuse link 26 such that a partial thickness of the semiconductor material of the fuse link 26 remains intact between a bottom of the trench 32 and the dielectric layer 14.

A layer 34 is formed inside the trench 32 and may conform to the shape of the trench 32. In an embodiment, the layer 34 may be comprised of a semiconductor material, such as silicon-germanium (SiGe). In an embodiment, the layer 34 may be comprised of silicon-germanium with a germanium content of about five atomic percent (5%) to about fifty atomic percent (50%). The layer 34 may be formed by an epitaxial growth process. More specifically, the layer 34 may be epitaxially grown from the surfaces of the semiconductor layer 20 bordering the trench 32. In an embodiment, the layer 34 may be formed by a selective epitaxial growth process in which the semiconductor material does not nucleate and form on dielectric surfaces, such as the surfaces of the patterned dielectric layer 30. In an embodiment, the trench 32 and layer 34 may be centered in the fuse link 26 between the terminal 22 and the terminal 24.

In an embodiment, the layer 34 may be laterally and vertically surrounded by the semiconductor material of the semiconductor layer 20 such that the layer 34 is embedded in the fuse link 26. The semiconductor material of the semiconductor layer 20 has a different composition from the semiconductor material of the layer 34 that provided a composition contrast that impacts subsequent silicide formation. In an alternative embodiment, the layer 34 may be comprised of a dielectric material, such as silicon dioxide, that is an insulator and that does not support silicide formation.

With reference to FIGS. 5, 6, 6A, 6B in which like reference numerals refer to like features in FIGS. 3, 4, 4A, 4B and at a subsequent fabrication stage, the dielectric layer 30 may be removed by an etching process. A semiconductor layer 36 is formed over the terminals 22, 24, the fuse link 26, and the layer 34. The semiconductor layer 36 may be comprised of a semiconductor material, such as silicon, and may be free of germanium to provide a composition contrast with the layer 34. The semiconductor layer 36 may be formed by an epitaxial growth process. In an embodiment, the semiconductor layer 36 may be formed by a selective epitaxial growth process in which the semiconductor material does not nucleate and form on dielectric surfaces, such as the shallow trench isolation region 18 surrounding the terminals 22, 24 and fuse link 26. In an embodiment, the semiconductor layer 36 may be formed with a uniform thickness. In an embodiment, the semiconductor layer 36 may directly contact the terminals 22, 24 and the fuse link 26 provided by the patterned semiconductor layer 20, and may also directly contact the layer 34.

Figure 7:
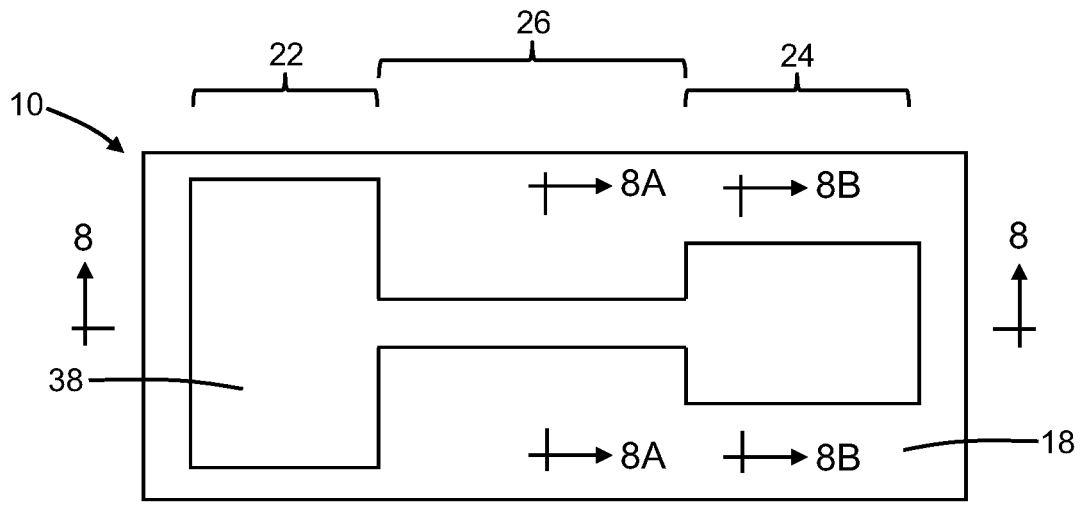
FIG. 7 is a top view of the structure at a fabrication stage subsequent to FIG. 5.
Figure 8:
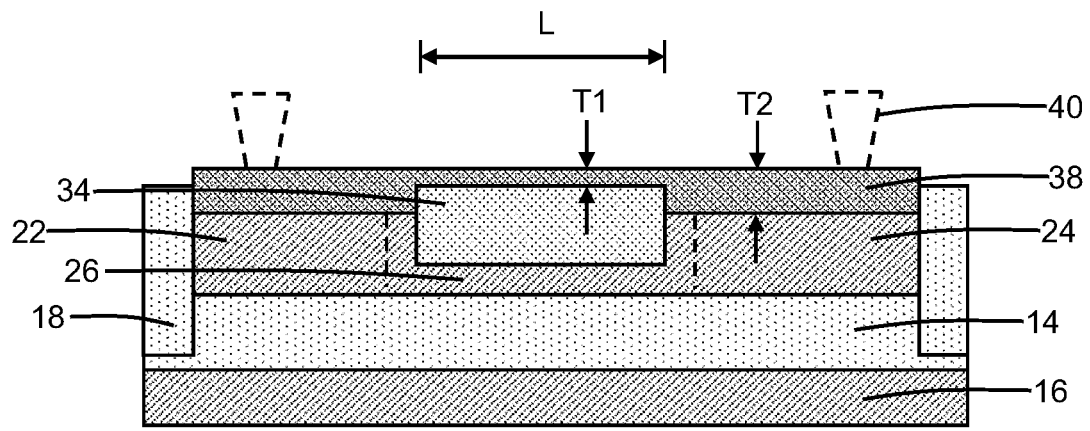
FIG. 8 is a cross-sectional view taken generally along line 8-8 in FIG. 7.
Figures 8A, 8B:
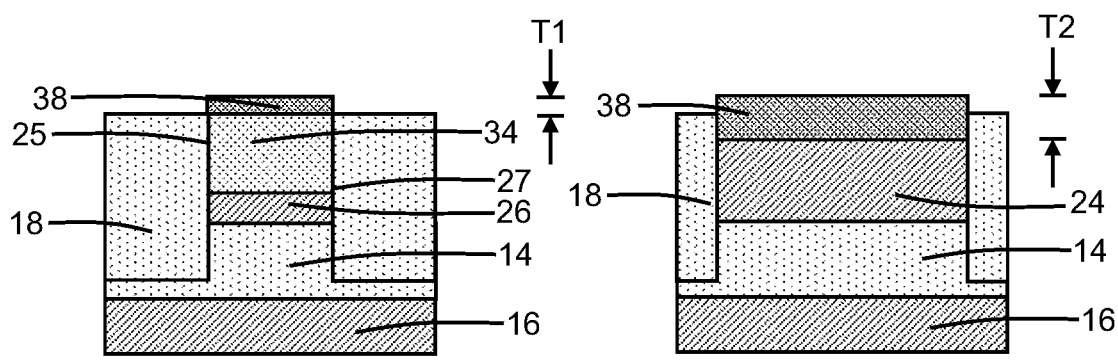
FIG. 8A is a cross-sectional view taken generally along line 8A-8A in FIG. 7.
FIG. 8B is a cross-sectional view taken generally along line 8B-8B in FIG. 7.

With reference to FIGS. 7, 8, 8A, 8B in which like reference numerals refer to like features in FIGS. 5, 6, 6A, 6B and at a subsequent fabrication stage, a silicide layer 38 is formed using the semiconductor material of the semiconductor layer 36 and the semiconductor material of the semiconductor layer 20 beneath the semiconductor layer 36. The silicide layer 38 may be formed by a silicidation process that involves one or more annealing steps to form a silicide phase by reacting a deposited layer of silicide-forming metal with the semiconductor materials of the semiconductor layers 20, 36. Candidate silicide-forming metals may include, for example, cobalt or nickel. The silicide-forming metal may be deposited by, for example, a physical vapor deposition process. A capping layer comprised of a metal nitride, such as sputter-deposited titanium nitride, may be applied to cap the silicide-forming metal. An initial annealing step of the silicidation process may form a metal-rich silicide that consumes the silicide-forming metal and then forms a silicide of lower metal content that grows by consuming the metal-rich silicide. Following the initial annealing step, any remaining silicide-forming metal and the optional capping layer may be removed by wet chemical etching. The silicide layer 38 may then be subjected to an additional annealing step at a higher temperature to form a lower-resistance silicide phase.

The silicide layer 38 has multiple thicknesses that lead to a thickness differential over the total length of the fuse link 26. Specifically, a portion of the silicide layer 38 included in the fuse link 26 that has a thickness T1, a portion of the silicide layer 38 included in the terminals 22, 24 that has a thickness T2, and the thickness T1 is less than the thickness T2. In the representative embodiment, the portion of the silicide layer 38 with the thickness T1 extends over a length L that is a fraction of the total length of the fuse link 26 between the terminal 22 and the terminal 24. In the representative embodiment, the portion of the silicide layer 38 with the thickness T1 extends across the entire width W of the fuse link 26 from the sidewall 25 to the sidewall 27. In an embodiment, the thinner portion of the silicide layer 38 may be centered in the fuse link 26 between the terminal 22 and the terminal 24.

The thickness differential arises because the layer 34 operates to limit the thickness T1 of the corresponding portion of the silicide layer 38 included in the portion of the fuse link 26. The material (e.g., silicon-germanium or a dielectric material) constituting the layer 34 forms silicide at either a negligible rate or a significantly lower rate than the semiconductor material (e.g., silicon) of the semiconductor layer 36 and the semiconductor material (e.g., silicon) of the semiconductor layer 20. In an embodiment, the thickness T1 of the portion of the silicide layer 38 included in the fuse link 26 may be uniform. In an embodiment, the thickness T1 of the portion of the silicide layer 38 included in the fuse link 26 may be uniform, and the thickness T2 may exhibit a significant thickness variation. The thickness T1 of the silicide layer 38 may be uniform because the portion of the semiconductor layer 36 over the layer 34 is fully silicided and has an abrupt (e.g., planar) interface with the underlying layer 34 that is not silicided or only negligibly silicided.

Middle-of-line (MOL) processing follows to form an interconnect structure having contacts 40 that are coupled to the terminals 22, 24 of the electronic fuse 10.

Before programming is initiated, the electronic fuse 10 has an initial state characterized by a low value of electrical resistance. Specifically, in the initial unprogrammed state, the fuse link 26 defines a closed circuit path of low resistance that extends from the terminal 22 to the terminal 24. The terminals 22, 24 of the electronic fuse 10 may be connected with programming circuitry, which may include one or more transistors (e.g., one or more thick-oxide field-effect transistors) designed to draw a large amount of current. The electronic fuse 10 may also be connected with sense circuitry that reads the state of the electronic fuse 10. The sense circuitry can measure the electrical resistance of the electronic fuse 10 to determine whether or not the electronic fuse 10 has been programmed. Control logic directs the fuse program operations of the programming circuitry and the fuse read operations of the sense circuitry.

During programming of the electronic fuse 10, a voltage is applied between terminal 22 and the terminal 24 either in a pulse train or as a lengthier single pulse. Electrical current with a high current density flows through the fuse link 26 and, in particular, primarily through the thinner portion of the silicide layer 38 included in the fuse link 26. As electrical current flows through the fuse link 26, ohmic heating occurs that rapidly increases the temperature of the fuse link 26. The fuse link 26 will eventually blow as the temperature increases, after which the programmed electronic fuse 10 will exhibit a high electrical resistance. Once programmed, the electronic fuse 10 cannot be re-programmed back to a low-resistance state because the programming operation is irreversible.

The thickness differential of the silicide layer 38, and in particular the thinner portion (i.e., thickness T1) of the silicide layer 38 included in the fuse link 26, may function to locally increase the temperature during programming and thereby improve the programming efficiency for the electronic fuse 10. The thickness of the silicide layer 38 is modulated because of the modification to the fuse link 26 that introduces the layer 34, which does not support silicide formation.

The thinner portion of the silicide layer 38 included in the fuse link 26 may also have a uniform thickness because the layer 34 blocks further silicidation after the portion of the semiconductor layer 36 over the layer 34 is fully silicided. The uniform thickness may contrast with silicide layers of conventional electronic fuses that exhibit a non-uniform thickness with significant thickness variations.

A group of nominally-identical electronic fuses 10 may exhibit a lower variability in their electrical resistance in the programmed condition, as well as a lower variability in their electrical resistance in the unprogrammed condition. The length of the thinner portion of the silicide layer 38 can be engineered to confine the region over which the electronic fuse 10 is blown by programming. The thinner portion of the silicide layer 38 included in the fuse link 26 and/or its unform thickness may permit the width of the fuse link 26 to be increased compared with the fuse links of conventional electronic fuses, which may assist with the patterning process. The improved programming efficiency may permit the field-effect transistor(s) used during programming to be scaled to have a smaller footprint.

With reference to FIGS. 9, 10, 10A, 10B and in accordance with alternative embodiments, the trench 32 and the layer 34 formed inside the trench 32 may extend over the full length of the electronic fuse 10. The trench 32 may be formed with a lateral undercut using an etching process with a lateral etching component such that portion of the layer 34 inside the trench 32 in the fuse link 26 is surrounded by the semiconductor material of the fuse link 26. In addition to extending over the entire length of the fuse link 26, the thinner portion of the silicide layer 38 may extend across only a portion of the width W of the fuse link 26 and is positioned with a lateral offset from the sidewall 25 and a lateral offset from the sidewall 27. The silicide layer 38 having the smaller thickness (i.e., thickness T1) is located in a portion of each of the terminals 22, 24, and the silicide layer 48 having the larger thickness (i.e., thickness T2) is located in a portion of each of the terminals 22, 24.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features overlap if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a structure for an electronic fuse, the method comprising:

forming a first terminal, a second terminal, and a fuse link extending from the first terminal to the second terminal, wherein the fuse link has a width that is less than a width of the first terminal and less than a width of the second terminal;

forming a trench in the fuse link;

forming a first layer inside the trench, wherein the first layer comprises a first material;

forming a second layer on the first layer, the first terminal, and the second terminal, wherein the second layer comprises a semiconductor material that is free of germanium; and performing a silicidation process that reacts a silicide-forming metal with the semiconductor material of the second layer to form a silicide layer having a first portion on the first layer with a first thickness that is included in the fuse link and a second portion with a second thickness that is included in the first terminal and the second terminal, wherein the first thickness is less than the second thickness, the first portion of the silicide layer extends over one-half of a length of the fuse link, the first portion of the silicide layer is free of germanium, and the first thickness is uniform over the first portion of the silicide layer.

2. The method of claim 1 wherein the fuse link includes a third layer beneath the first layer, and the third layer comprises a second material having a different composition from the first material.

3. The method of claim 2 wherein the first portion of the silicide layer is in direct contact with the first layer over the fuse link.

4. The method of claim 3 wherein the first material is silicon-germanium or a dielectric material, and the second material is silicon.

5. The method of claim 1 wherein the fuse link has a first sidewall and a second sidewall that each extend from the first terminal to the second terminal, and the first portion of the silicide layer extends from the first sidewall to the second sidewall.

6. The method of claim 1 wherein the second layer is fully silicided, and the silicide layer has an interface with the first layer.

7. The method of claim 1 wherein the first portion of the silicide layer is centered between the first terminal and the second terminal.

* * * * *